(12) United States Patent
Kim et al.

(10) Patent No.: US 10,396,789 B2
(45) Date of Patent: Aug. 27, 2019

(54) POWER GATING CONTROL CIRCUIT

(71) Applicant: SK hynix Inc., Icheon-si, Gyeonggi-do (KR)

(72) Inventors: Woongrae Kim, Icheon-si (KR); Tae Yong Lee, Seoul (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/042,814

(22) Filed: Jul. 23, 2018

(65) Prior Publication Data

US 2019/0199350 A1 Jun. 27, 2019

(30) Foreign Application Priority Data

Dec. 21, 2017 (KR) .......................... 10-2017-0176843

(51) Int. Cl.
*H03K 19/00* (2006.01)
*H03K 5/00* (2006.01)
*H03K 19/003* (2006.01)

(52) U.S. Cl.
CPC ........... *H03K 19/0008* (2013.01); *H03K 5/00* (2013.01); *H03K 19/003* (2013.01); *H03K 2005/00078* (2013.01)

(58) Field of Classification Search
CPC .... H03K 19/0008; H03K 19/003; H03K 5/00; H03K 2005/00078
USPC .......................................................... 326/82
See application file for complete search history.

(56) References Cited

U.S. PATENT DOCUMENTS

| 6,107,700 | A | * | 8/2000 | Ishikawa | ................ G05F 1/465 307/116 |
| 6,169,419 | B1 | * | 1/2001 | De | .................... H03K 19/0016 326/121 |
| 7,254,082 | B2 | * | 8/2007 | Watanabe | ............. G06F 1/3203 327/530 |
| 9,407,264 | B1 | | 8/2016 | Ali et al. | |
| 9,450,580 | B2 | | 9/2016 | Lundberg | |
| 2010/0066406 | A1 | * | 3/2010 | Noda | ................. H03K 19/0016 326/33 |

* cited by examiner

*Primary Examiner* — Daniel D Chang
(74) *Attorney, Agent, or Firm* — William Park & Associates Ltd.

(57) ABSTRACT

A power gating control circuit may include a transmission control circuit configured to receive a first fuse signal and output a second fuse signal based on a level of the first fuse signal in a normal mode or output a second fuse signal regardless of a level of the first fuse signal in a power down mode. The power gating control circuit may include a logic circuit block including logic gates and configured to apply the second fuse signal to the logic gates.

19 Claims, 5 Drawing Sheets

POWER GATING CONTROL CIRCUIT

CROSS-REFERENCES TO RELATED APPLICATION

The present application claims priority under 35 U.S.C. § 119(a) to Korean application number 10-2017-0176843, filed on Dec. 21, 2017, in the Korean Intellectual Property Office, which is incorporated herein by reference in its entirety.

BACKGROUND

1. Technical Field

Various embodiments generally relate to a semiconductor circuit, and, more particularly, to a power gating control circuit.

2. Related Art

While electronic devices, e.g., portable electronic devices, are being reduced in size and weight, the number of functional blocks installed in the portable electronic devices is continuously increasing.

Particularly, since the portable electronic devices operate based on a limited power supply, i.e., a battery, unnecessary power consumption due to the functional blocks in a standby state, i.e., in a power down mode, should be reduced.

To this end, a power gating technique for preventing power from being unnecessarily supplied to the functional blocks in the power down mode is applied to such a portable electronic device.

Referring to FIG. 1, a power gated logic circuit block to which typical zigzag power gating is applied may include transistor logics 11 to 16.

The transistors 11 and 12 are turned off in a power down mode to cut off the power supply of the other transistor logics 13 to 16.

While a power supply terminal VDD and a ground terminal VSS are power sources unrelated to the transistors 11 and 12, a virtual power supply terminal Virtual VDD and a virtual ground terminal Virtual VSS are power sources capable of cutting off the supply of power in response to turning off the transistors 11 and 12.

Therefore, each of the transistor logics 13 to 16 is selectively coupled to any one of the power supply terminal VDD, the ground terminal VSS, the virtual power supply terminal Virtual VDD, and the virtual ground terminal Virtual VSS and performs power gating such that the output thereof has a set value in the power down mode.

For example, an input of the inverter 13 is set to logic '1' in the power down mode. The inverter 13 is coupled between the virtual power supply terminal Virtual VDD and the ground terminal VSS. Therefore, an output of the inverter 13 is logic '0', and an output of the inverter 14 is logic '1'.

Because the output of the inverter 14 is logic '1', a transistor coupled to the ground terminal VSS of the transistor logic 15 is turned on regardless of the turned off state of the transistor 11 so that the output of the inverter 16 may be maintained in logic '1' identical with that of the input of the inverter 13.

The above-described typical zigzag power gating can be used in only a logic circuit block of which the logic state in the power down mode is fixed and maintained at a predetermined level.

However, the typical zigzag power gating cannot be used in a logic circuit block of which the logic state may vary, e.g., in a logic circuit block using signals of fuse circuits related to a test mode. Therefore, since the power gating may be applied to only some of the all logic circuit blocks of the electronic device, there is a limit in reducing the current consumption.

SUMMARY

In an embodiment, a power gating control circuit may be provided. The power gating control circuit may include a logic circuit block including logic gates, the logic circuit block configured to cut off power to the logic gates in a power down mode, and perform an originally intended function with the logic gates using a fuse signal provided from an external device in a normal mode. The power gating control circuit may include a transmission control circuit configured to block the fuse signal from being applied to the logic circuit block in the power down mode.

In an embodiment, a power gating control circuit may be provided. The power gating control circuit may include a test mode circuit configured to generate a first fuse signal. The power gating control circuit may include a logic circuit block including logic gates and configured to cut off power to the logic gates in response to a power down signal, and fix an output level of the logic gates to a level corresponding to a power down mode using a second fuse signal. The power gating control circuit may include a transmission control circuit configured to generate the power down signal based on a standby signal, and generate the second fuse signal having a value unrelated to the first fuse signal.

In an embodiment, a power gating control circuit may be provided. The power gating control circuit may include a transmission control circuit configured to receive a first fuse signal and output a second fuse signal based on a level of the first fuse signal in a normal mode or output a second fuse signal regardless of a level of the first fuse signal in a power down mode. The power gating control circuit may include a logic circuit block including logic gates and configured to apply the second fuse signal to the logic gates.

DETAILED DESCRIPTION

Hereinafter, a power gating control circuit will be described below with reference to the accompanying drawings through various examples of embodiments.

Various embodiments may provide a power gating control circuit capable of minimizing the current consumption of an electronic device.

Further, the logic levels of the signals may be different from or the opposite of those described. For example, a signal described as having a logic "high" level may alternatively have a logic "low" level, and a signal described as having a logic "low" level may alternatively have a logic "high" level.

Figure 1:
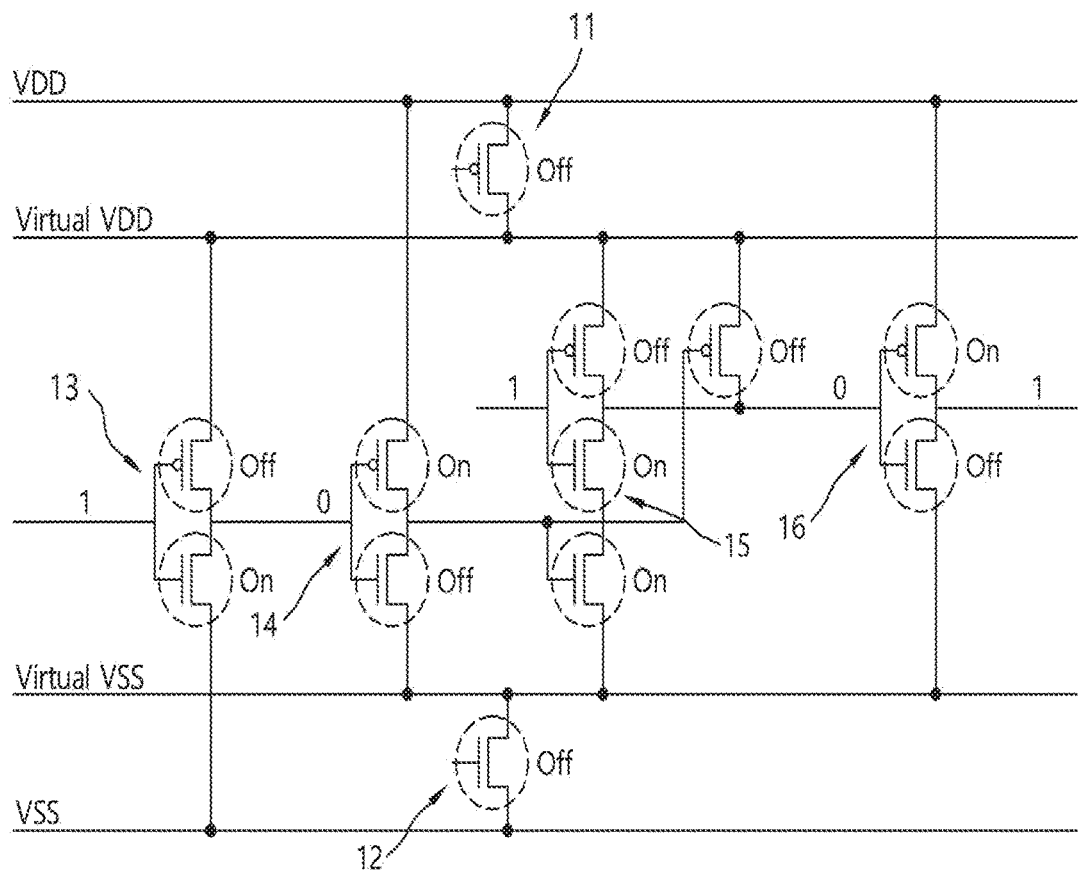
FIG. 1 is a diagram illustrating a configuration of a logic circuit block to which typical power gating is applied.
Figure 2:
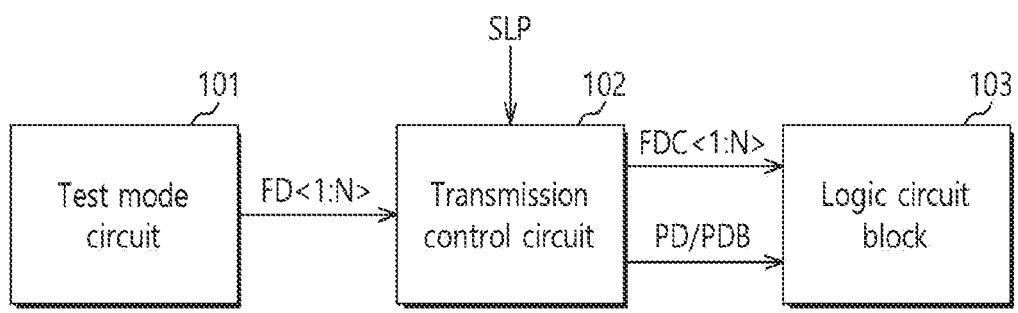
FIG. 2 is a diagram illustrating a configuration of a power gating control circuit in accordance with an embodiment.

FIG. 2 is a diagram illustrating a configuration of a power gating control circuit 100 in accordance with an embodiment.

Referring to FIG. 2, the power gating control circuit 100 in accordance with an embodiment may include a logic circuit block 103 and a transmission control circuit 102.

The power gating control circuit 100 in accordance with the embodiment may further include a test mode circuit 101 configured to generate a first fuse signal FD<1:N>.

The logic circuit block 103 may be configured to cut off the power of logic circuits in response to a power down signal PD/PDB, and perform its originally intended function in a normal mode using a fuse signal, i.e., the first fuse signal FD<1:N>, provided from an external device. In an embodiment, the logic circuit block 103 may be configured to cut off the power of the logic circuits in response to the power down signal PD/PDB by electrically disconnecting the source from the drain or the drain from the source to electrically disconnect the power supply terminal, virtual power supply terminal, the ground terminal, and/or virtual ground terminal from the logic circuits. For example, referring to FIG. 6, the first transistor 401 may electrically disconnect the power supply terminal VDD from the logic gates and the virtual power supply terminal Virtual VDD in response to the power down bar signal PDB and the second transistor 402 may electrically disconnect the ground terminal VSS from the logic gates and the virtual ground terminal Virtual VSS in response to the power down signal PD.

The logic circuit block 103 may cut off the power of the internal logic circuits in response to the power down signal PD/PDB, and fix an output level thereof to a preset level using a second fuse signal FDC<1:N> such that the output level corresponds to a power down mode.

When the power down signal PD/PDB is enabled, the logic circuit block 103 may cut off the power of the internal logic circuits, and fix the output level thereof to the preset level using the second fuse signal FDC<1:N> such that the output level corresponds to the power down mode.

When the power down signal PD/PDB is disabled, the logic circuit block 103 may supply power to the internal logic circuits, and perform its originally intended function using the second fuse signal FDC<1:N>.

The transmission control circuit 102 may generate a power down signal PD/PDB in response to a standby signal SLP, and block the first fuse signal FD<1:N> from being inputted to the logic circuit block 103.

The transmission control circuit 102 may block the first fuse signal FD<1:N> from being inputted to the logic circuit block 103 before the power down signal PD/PDB is enabled, and input the first fuse signal FD<1:N> to the logic circuit block 103 after the power down signal PD/PDB is disabled.

The transmission control circuit 102 may generate a power down signal PD/PDB in response to a standby signal SLP, and output a second fuse signal FDC<1:N> having a value (e.g., an inverted value) corresponding to the first fuse signal FD<1:N>, or generate a second fuse signal FDC<1:N> having a preset value unrelated to the first fuse signal FD<1:N>.

When the standby signal SLP is enabled, the transmission control circuit 102 may enable the power down signal PD/PDB, and change the logic level of the second fuse signal FDC<1:N> to a preset level unrelated to the first fuse signal FD<1:N>.

When the standby signal SLP is disabled, the transmission control circuit 102 may disable the power down signal PD/PDB, and invert the first fuse signal FD<1:N> and output it as the second fuse signal FDC<1:N>.

The test mode circuit 101 may generate a first fuse signal FD<1:N> for selectively enabling/disabling the logic circuits of the logic circuit block 103 or changing operational options of some of the logic circuits.

Figure 3:
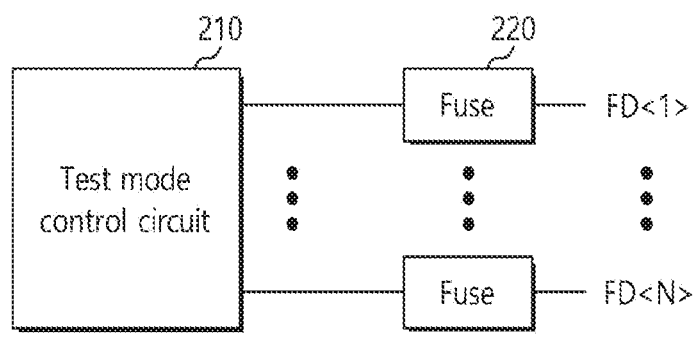
FIG. 3 is a diagram illustrating a configuration of a test mode circuit of FIG. 2.

FIG. 3 is a diagram illustrating a configuration of the test mode circuit 101 of FIG. 2.

Referring to FIG. 3, the test mode circuit 101 may include a test mode control circuit 210 and a plurality of fuses 220.

The test mode control circuit 210 may selectively program the plurality of fuses 220 to correspond to the selectively enabling/disabling of the logic circuits or the changing of the optional options of some of the logic circuits.

The plurality of fuses 220 may store and output programmed data as the first fuse signal FD<1:N>.

Here, since the selectively enabling/disabling of the logic circuits or the changing of the operational options of some of the logic circuits are variable, the first fuse signal FD<1:N> may also have a random value.

Figure 4:
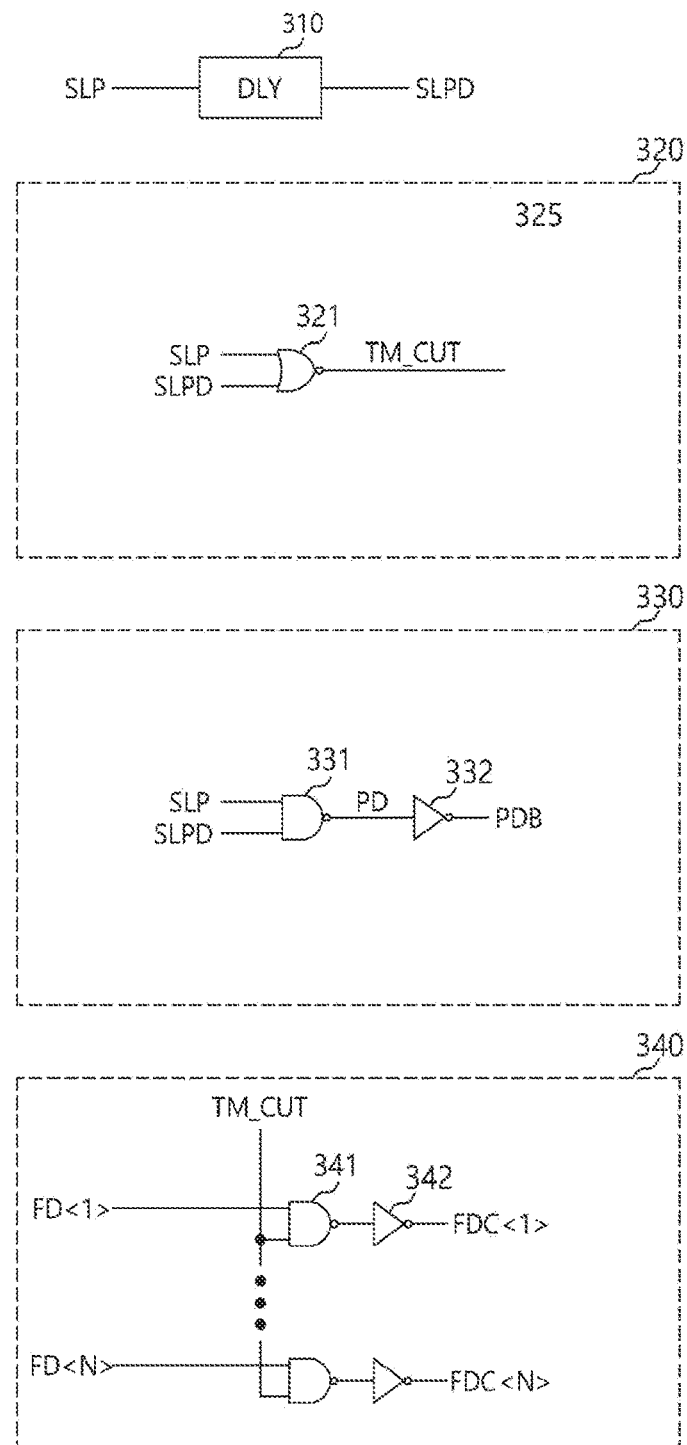
FIG. 4 is a diagram illustrating a configuration of a transmission control circuit of FIG. 2.

FIG. 4 is a diagram illustrating a configuration of the transmission control circuit 102 of FIG. 2.

Referring to FIG. 4, the transmission control circuit 102 may include a delay unit (DLY) 310, a fuse cut signal generating circuit 320, a power down signal generating circuit 330, and a fuse cut logic circuit 340.

The delay unit 310 may generate a delayed standby signal SLPD by delaying the standby signal SLP by a predetermined time.

The fuse cut signal generating circuit 320 may generate a fuse cut signal TM_CUT in response to the standby signal SLP and the delayed standby signal SLPD.

The power down signal generating circuit 330 may generate a power down signal PD/PDB in response to the standby signal SLP and the delayed standby signal SLPD.

The fuse cut logic circuit 340 may generate a second fuse signal FDC<1:N> by bypassing the first fuse signal FD<1:N> in response to the fuse cut signal TM_CUT, or output a second fuse signal FDC<1:N> having a preset value, e.g., a low level, unrelated to the first fuse signal FD<1:N>.

In an embodiment, the fuse cut signal generating circuit 320 may include a NOR gate 321 configured to perform a NOR operation on the standby signal SLP and the delayed standby signal SLPD and output a resultant signal as the fuse cut signal TM_CUT. Furthermore, the configuration of a logic gate or logic gates required for implementing the same function or operation discussed with regards to the fuse cut signal generating circuit 320 may be modified. That is, the logic gate configuration of one type of operation and another logic gate configuration for the same type of operation may be replaced with each other, depending on a specific situation. If necessary, various logic gates may be applied to implement the configurations.

In an embodiment, the power down signal generating circuit 330 may include a NAND gate 331 configured to perform a NAND operation on the standby signal SLP and the delayed standby signal SLPD and output a resultant signal as the power down signal PD, and an inverter 332 configured to invert the power down signal PD and output it as a power down bar signal PDB. Furthermore, the configuration of a logic gate or logic gates required for implementing the same function or operation discussed with regards to the power down signal generating circuit 330 may be modified. That is, the logic gate configuration of one type of operation and another logic gate configuration for the same type of operation may be replaced with each other, depending on a specific situation. If necessary, various logic gates may be applied to implement the configurations.

In an embodiment, the fuse cut logic circuit 340 may include a plurality of NAND gates 341, and a plurality of inverters 342. Furthermore, the configuration of a logic gate or logic gates required for implementing the same function or operation discussed with regards to the fuse cut logic circuit 340 may be modified. That is, the logic gate configuration of one type of operation and another logic gate configuration for the same type of operation may be replaced with each other, depending on a specific situation. If necessary, various logic gates may be applied to implement the configurations.

When the fuse cut signal TM_CUT is enabled (e.g., makes a transition to a low level), each of the NAND gates 341 may output a second fuse signal FDC<1:N> at a low level regardless of the level of a first fuse signal FD<1:N>.

When the fuse cut signal TM_CUT is disabled (e.g., makes a transition to a high level), each of the NAND gates 341 may bypass each signal bit of the first fuse signal FD<1:N> and output it as a second fuse signal FDC<1:N>.

Figure 5:
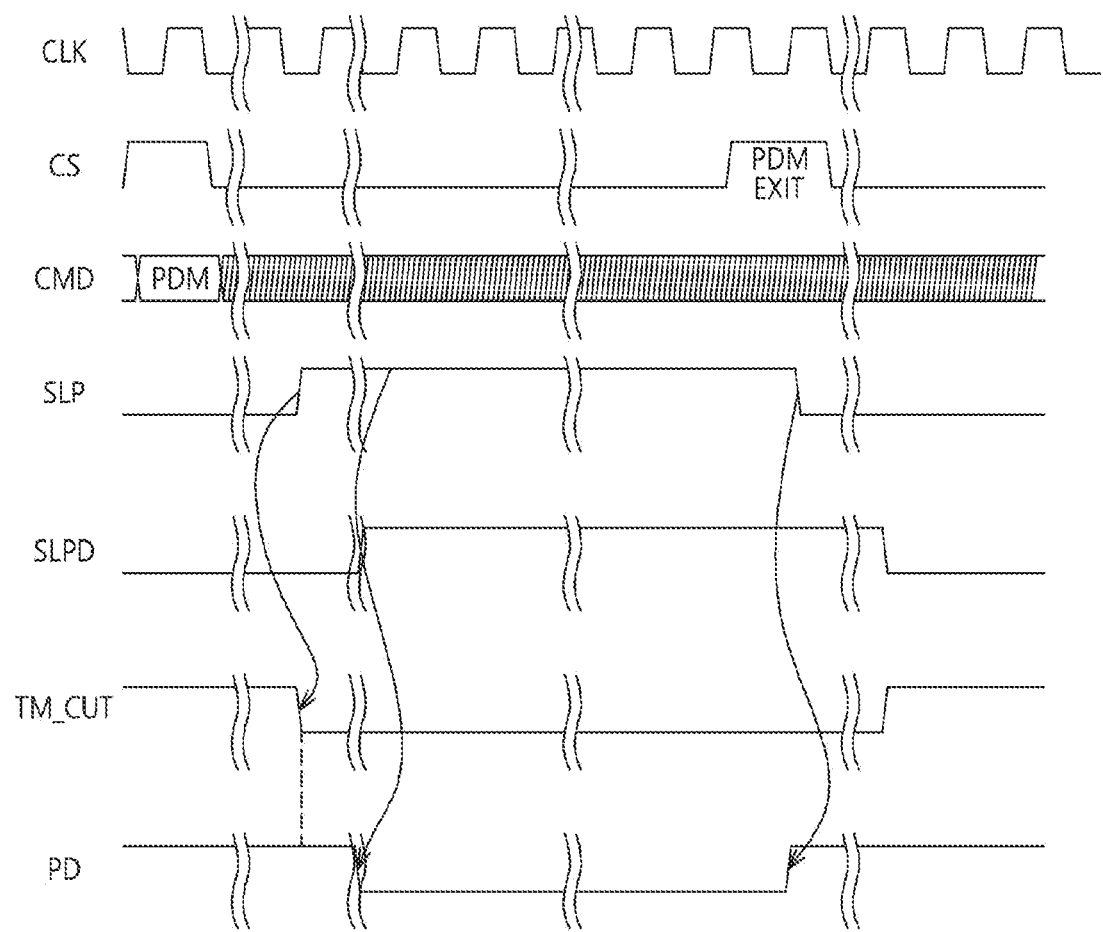
FIG. 5 is a timing diagram illustrating an operation of the transmission control circuit of FIG. 4.

FIG. 5 is a timing diagram illustrating an operation of the transmission control circuit 102 of FIG. 4.

The operation of the transmission control circuit 102 will be described with reference to FIGS. 4 and 5.

As a power down mode entry PDM is performed by a combination of a chip select signal CS and a command CMD, the standby signal SLP is enabled (makes a transition to a high level).

As the standby signal SLP makes a transition to the high level, the fuse cut signal TM_CUT is enabled (makes a transition to a low level).

As the fuse cut signal TM_CUT makes a transition to the low level, the fuse cut logic circuit 340 outputs the second fuse signal FDC<1:N> at the low level regardless of the level of the first fuse signal FD<1:N>.

After a predetermined delay time has passed after the standby signal SLP has made a transition to the high level, the delayed standby signal SLPD makes a transition to a high level.

As the delayed standby signal SLPD makes a transition to the high level, the power down signal generating circuit 330 enables the power down signal PD (makes a transition to a low level). In other words, the power down signal generating circuit 330 maintains the power down signal PD at the low level while both the standby signal SLP and the delayed standby signal SLPD remain at the high level.

Thereafter, as power down mode exit PDM EXIT is performed by the transition of the chip select signal CS, i.e., as the normal mode starts, the standby signal SLP is disabled (makes a transition to a low level).

As the standby signal SLP makes a transition to the low level, the power down signal generation circuit 330 disables the power down signal PD (makes a transition to a high level).

After the standby signal SLP has made a transition to the low level, the delayed standby signal SLPD remains at the high level for a predetermined delay time.

Because, although the standby signal SLP has made a transition to the low level, the delayed standby signal SLPD remains at the high level, the fuse cut signal generating circuit 320 maintains the fuse cut signal TM_CUT at the low level.

Subsequently, as the delayed standby signal SLPD makes a transition to a low level, the fuse cut signal generating circuit 320 transitions the fuse cut signal TM_CUT to a high level.

As the fuse cut signal TM_CUT makes a transition to the high level, the fuse cut logic circuit 340 bypasses the first fuse signal FD<1:N> and outputs it as the second fuse signal FDC<1:N>.

Here, in the case where the value of the first fuse signal FD<1:N> is applied to a logic circuit after the power down mode entry or before the power down mode exit, floating of the corresponding logic circuit may be induced, and thereafter a short circuit current problem of logic circuits may be caused.

Consequently, in an embodiment, as described above, the fuse cut signal TM_CUT is enabled in advance before the power down signal PD is enabled, and the fuse cut signal TM_CUT is disabled after the power down signal PD is disabled, whereby the value of the first fuse signal FD<1:0> may be prevented from being applied to a logic circuit while the power down mode is performed.

Figure 6:
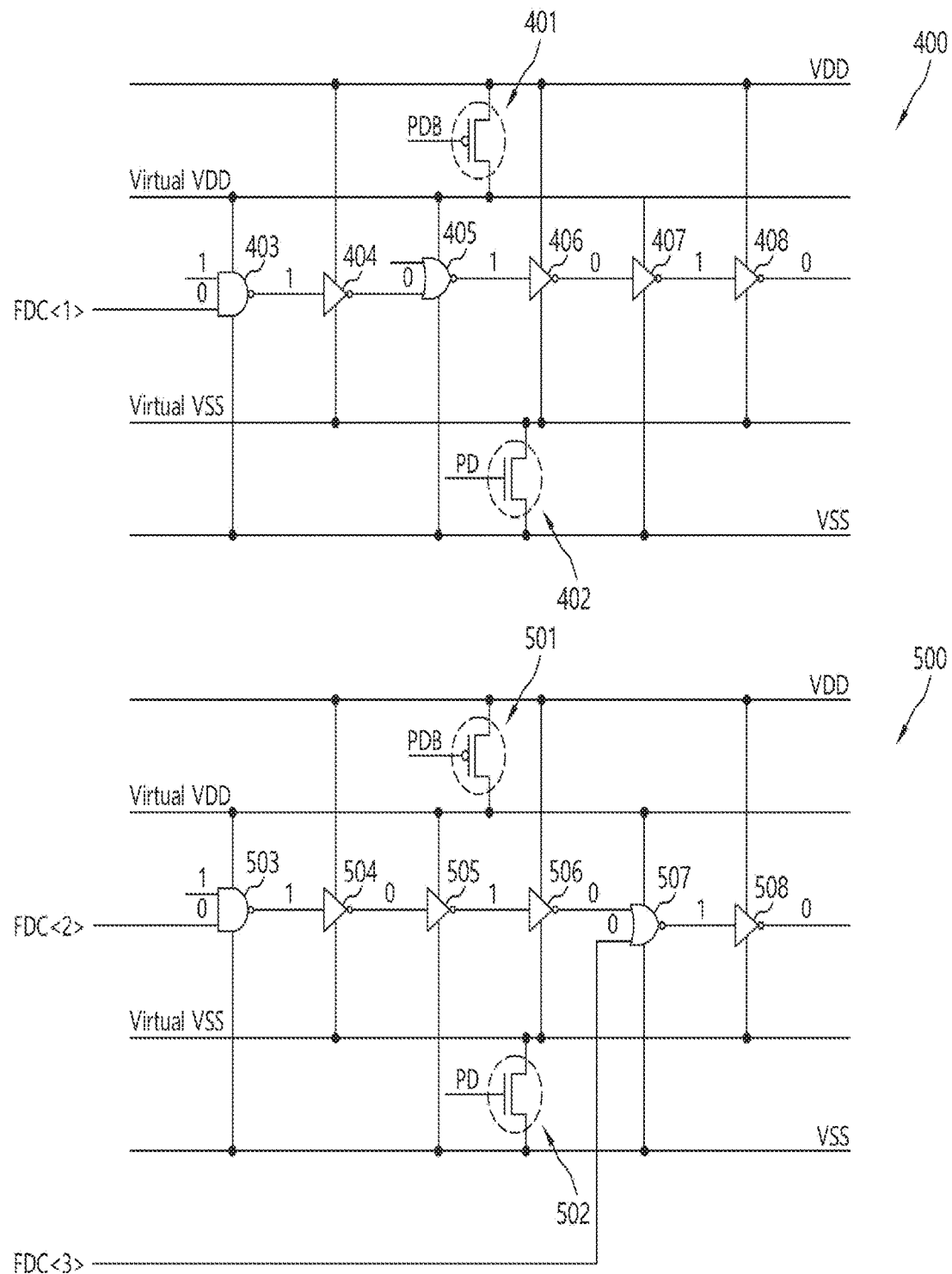
FIG. 6 is a diagram illustrating a configuration of a logic circuit block of FIG. 2.

FIG. 6 is a diagram illustrating a configuration of the logic circuit block 103 of FIG. 2.

Referring to FIG. 6, the logic circuit block 103 may include a plurality of logic circuits, e.g., a first logic circuit 400 and a second logic circuit 500.

The first logic circuit 400 may include first and second transistors 401 and 402 and logic gates 403 to 408. As used herein, the words "logic gates" can include one or more circuits.

Each of the first and second transistors 401 and 402 may be turned off when the power down signal PD/PDB is at a disabled level (low/high level), whereby the power supply terminal (VDD) level may be blocked from being applied to the logic gates 403, 405, and 407 coupled with the virtual power supply terminal Virtual VDD and the virtual ground terminal Virtual VSS.

Each of the transistor logics 403 to 408 is selectively coupled to any one of the power supply terminal VDD, the ground terminal VSS, the virtual power supply terminal Virtual VDD, and the virtual ground terminal Virtual VSS and performs power gating such that the output thereof has a preset value in the power down mode.

The logic gate 403 has input terminals, one of which is fixed to a high level in the power down mode, and the other one of which receives any one (e.g., FDC<1>) of the second fuse signals FDC<1:N> in the power down mode.

In the power down mode, the second fuse signal FDC<1> is at the low level regardless of the first fuse signal FD<1>, so that a final output signal which has passed through the other logic gates 404 to 408 is also fixed to the low level. Thus, the first logic circuit 400 may not perform its originally intended function in response to the second fuse signal FDC<1> fixed at low level regardless of the first fuse signal FD<1>.

If the power gating control circuit enters the normal mode, i.e., exits the power down mode, the first logic circuit 400 may perform its originally intended function in response to the second fuse signal FDC<1:N> having the same logic level as that of the first fuse signal FD<1:N>.

The second logic circuit 500 may include first and second transistors 501 and 502 and logic gates 503 to 508.

Each of the first and second transistors 501 and 502 may be turned off when the power down signal PD/PDB is at a disabled level (low/high level), whereby the power supply terminal (VDD) level may be blocked from being applied to the logic gates 503, 505, and 507 coupled with the virtual power supply terminal Virtual VDD and the virtual ground terminal Virtual VSS.

Each of the transistor logics 503 to 508 is selectively coupled to any one of the power supply terminal VDD, the ground terminal VSS, the virtual power supply terminal Virtual VDD, and the virtual ground terminal Virtual VSS and performs power gating such that the output thereof has a preset value in the power down mode.

The logic gate 503 has input terminals, one of which is fixed to a high level in the power down mode, and the other one of which receives any one (e.g., FDC<2>) of the second fuse signals FDC<1:N> in the power down mode.

Another logic gate 507 has input terminals, one of which receives an output (low level) of the preceding inverter 506 in the power down mode, and the other one of which receives another one (e.g., FDC<3>) of the second fuse signals FDC<1:N> in the power down mode.

In the power down mode, the second fuse signals FDC<2, 3> are at the low level regardless of the first fuse signals FD<2, 3>, so that a final output signal which has passed through the other logic gates 504 to 508 is also fixed to the low level.

If the power gating control circuit enters the normal mode, i.e., exits the power down mode, the second logic circuit 400 may perform its originally intended function in response to the second fuse signal FDC<1:N> having the same logic level as that of the first fuse signal FD<1:N>.

The zigzag power gating that selectively couples a logic circuit to any one of the power supply terminal VDD, the ground terminal VSS, the virtual power supply terminal Virtual VDD, and the virtual ground terminal Virtual VSS can be used in only a logical circuit block of which the logic state in the power down mode is fixed and maintained at a predetermined level, but cannot be used in a logic circuit block of which the logic state is variable, e.g., in a logic circuit block using signals of fuse circuits related to a test mode.

However, an embodiment of the present disclosure may be configured to prevent the logic state from varying in the power down mode, that is, prevent fuse signals related to the test mode from varying. Consequently, the embodiment may also be applied to logic circuits of which the logic states are variable. Therefore, the number of types of logic circuits to which the power gating can be applied is increased, whereby standby current may be further reduced.

Furthermore, in the power gating scheme, i.e., the zigzag power gating scheme, used in the power gating control circuit in accordance with an embodiment, there is no need to design an isolation circuit on a boundary between a logic circuit block to which the power gating is applied and a logic circuit block to which the power gating is not applied.

While various embodiments have been described above, it will be understood to those skilled in the art that the embodiments described are examples only. Accordingly, the data storage device and the operating method thereof described herein should not be limited based on the described embodiments.

What is claimed is:

1. A power gating control circuit comprising:
   a logic circuit block including logic gates, the logic circuit block configured to cut off power to the logic gates in response to a power down signal, and perform an originally intended function with the logic gates using a fuse signal provided from an external device in a normal mode; and
   a transmission control circuit configured to generate the power down signal in response to a standby signal, and block the fuse signal from being applied to the logic circuit block in response to the standby signal.

2. The power gating control circuit according to claim 1, wherein the logic circuit block includes a zigzag power gating structure including logic gates, and the logic gates are selectively coupled to a power supply terminal, a virtual power supply terminal, a ground terminal, and a virtual ground terminal.

3. The power gating control circuit according to claim 1, wherein the logic circuit block is configured to cut off the power to the logic gates based on the power down signal,
   wherein the transmission control circuit is configured to generate the power down signal based on the standby signal, and
   wherein the transmission control circuit comprises:
   a delay unit configured to generate a delayed standby signal by delaying the standby signal by a predetermined time;
   a fuse cut signal generating circuit configured to generate a fuse cut signal based on the standby signal and the delayed standby signal;
   a power down signal generating circuit configured to generate the power down signal based on the standby signal and the delayed standby signal; and
   a fuse cut logic circuit configured to invert the fuse signal based on the fuse cut signal and output the inverted fuse signal, or vary the fuse signal to a preset value unrelated to the fuse signal and output the varied fuse signal.

4. The power gating control circuit according to claim 3, wherein the fuse cut signal generating circuit is configured to perform a NOR operation on the standby signal and the delayed standby signal and output a resultant signal as the fuse cut signal.

5. The power gating control circuit according to claim 3, wherein the power down signal generating circuit is configured to perform a NAND operation on the standby signal and the delayed standby signal and output a resultant signal as the power down signal, and
   wherein the power down signal generating circuit is configured to invert the power down signal and output a resultant signal as a power down bar signal.

6. The power gating control circuit according to claim 1, wherein the transmission control circuit is configured to:
   wherein the transmission control circuit is configured to perform the originally intended function with the logic gates using the fuse signal received from the external device for a first duration in the normal mode and while in the normal mode, for a second duration, block the fuse signal from being inputted to the logic circuit block before a power down mode is entered, and
   wherein the transmission control circuit is configured to input the fuse signal to the logic circuit block after the power down signal is disabled.

7. A power gating control circuit comprising:
   a test mode circuit configured to generate a first fuse signal;
   a logic circuit block including logic gates and configured to cut off power to the logic gates in response to a power down signal, and fix an output level of the logic gates to a level corresponding to a power down mode using a second fuse signal; and
   a transmission control circuit configured to generate the power down signal based on a standby signal, and generate the second fuse signal having a value unrelated to the first fuse signal.

8. The power gating control circuit according to claim 7, wherein the logic circuit block includes a zigzag power gating structure including logic gates, and the logic gates are selectively coupled to a power supply terminal, a virtual power supply terminal, a ground terminal, and a virtual ground terminal.

9. The power gating control circuit according to claim 7, wherein the logic circuit block is configured to:
fix the output level to the level corresponding to the power down mode using the second fuse signal when the power down signal is enabled; and
perform an originally intended function of the logic circuit block using the second fuse signal when the power down signal is disabled.

10. The power gating control circuit according to claim 7, wherein the transmission control circuit is configured to:
enable the power down signal when the standby signal is enabled, and generate the second fuse signal having a preset value unrelated to the first fuse signal; and
disable the power down signal when the standby signal is disabled, and generate the second fuse signal having a value corresponding to the first fuse signal.

11. The power gating control circuit according to claim 7, wherein the transmission control circuit comprises:
a delay unit configured to generate a delayed standby signal by delaying the standby signal by a predetermined time;
a fuse cut signal generating circuit configured to generate a fuse cut signal in response to the standby signal and the delayed standby signal;
a power down signal generating circuit configured to generate the power down signal based on the standby signal and the delayed standby signal; and
a fuse cut logic circuit configured to generate the second fuse signal by inverting the first fuse signal based on the fuse cut signal, or generate the second fuse signal having a preset value unrelated to the first fuse signal.

12. The power gating control circuit according to claim 11, wherein the fuse cut signal generating circuit is configured to perform a NOR operation on the standby signal and the delayed standby signal and output a resultant signal as the fuse cut signal.

13. The power gating control circuit according to claim 11,
wherein the power down signal generating circuit is configured to perform a NAND operation on the standby signal and the delayed standby signal and output a resultant signal as the power down signal, and
wherein the power down signal generating circuit is configured to invert the power down signal and output a resultant signal as a power down bar signal.

14. The power gating control circuit according to claim 7, wherein the transmission control circuit is configured to:
generate the second fuse signal having a preset value unrelated to the first fuse signal before the power down signal is enabled; and
generate the second fuse signal having a value corresponding to the first fuse signal after the power down signal is disabled.

15. A power gating control circuit comprising:
a transmission control circuit configured to receive a first fuse signal and output a second fuse signal based on a level of the first fuse signal in a normal mode or output the second fuse signal regardless of a level of the first fuse signal in a power down mode; and
a logic circuit block including logic gates and configured to apply the second fuse signal to the logic gates,
wherein the output transmission control circuit is configured to output the second fuse signal regardless of the level of the first fuse signal in the power down mode and for a duration in the normal mode, and
wherein the transmission control circuit is configured to continue applying the second fuse signal regardless of a level of the first fuse signal for a duration past the power down mode.

16. The power gating control circuit according to claim 15,
wherein the output transmission control circuit is configured to output the second fuse signal regardless of the level of the first fuse signal in the power down mode and for a duration in the normal mode, and
wherein the transmission control circuit is configured to apply the second fuse signal regardless of a level of the first fuse signal for a duration before the power down mode and continuing into the power down mode.

17. The power gating control circuit according to claim 15, wherein the logic circuit block is configured to electrically couple, selectively, logic gates of the logic circuit block to a power supply in the normal mode.

18. The power gating control circuit according to claim 15, wherein the logic circuit block is configured to electrically couple, selectively, logic gates of the logic circuit block to a ground terminal in the normal mode.

19. The power gating control circuit according to claim 15, wherein the logic circuit block includes a zigzag power gating structure including logic gates, and the logic gates are selectively coupled to a power supply terminal, a virtual power supply terminal, a ground terminal, and a virtual ground terminal.

* * * * *